United States Patent
Tsilioukas

(10) Patent No.: US 8,331,893 B2
(45) Date of Patent: Dec. 11, 2012

(54) RECEIVER HAVING A GAIN-CONTROLLABLE INPUT STAGE

(75) Inventor: Efthimios Tsilioukas, Kassandria (GR)

(73) Assignee: NXP B.V., Eindhoven (NL)

( * ) Notice: Subject to any disclaimer, the term of this patent is extended or adjusted under 35 U.S.C. 154(b) by 652 days.

(21) Appl. No.: 11/815,209

(22) PCT Filed: Jan. 24, 2006

(86) PCT No.: PCT/IB2006/050248
§ 371 (c)(1),
(2), (4) Date: May 5, 2009

(87) PCT Pub. No.: WO2006/079969
PCT Pub. Date: Aug. 3, 2006

(65) Prior Publication Data
US 2009/0213276 A1      Aug. 27, 2009

(30) Foreign Application Priority Data
Jan. 31, 2005   (EP) .................................. 05100633

(51) Int. Cl.
*H04B 1/06* (2006.01)
(52) U.S. Cl. ............... 455/249.1; 455/245.1; 455/245.2; 330/284; 330/267; 329/363
(58) Field of Classification Search .................. 455/424, 455/425, 456.5, 456.6, 561, 550.1, 575.1, 455/232.1–254, 333, 219; 330/129, 279, 330/305, 267, 284; 348/725, 731; 329/363; 375/147, 349
See application file for complete search history.

(56) References Cited

U.S. PATENT DOCUMENTS

| | | | | |
|---|---|---|---|---|
| 3,613,008 A * | 10/1971 | Jabbar | ........................ | 455/250.1 |
| 4,019,160 A * | 4/1977 | Kam | ........................... | 333/81 R |
| 4,057,765 A * | 11/1977 | Schuermann | ................. | 330/279 |
| 4,275,362 A | 6/1981 | Harford | | |
| 4,369,414 A * | 1/1983 | Aoki et al. | .................. | 333/81 R |
| 4,520,507 A * | 5/1985 | Moon | ........................... | 725/151 |
| 4,590,417 A * | 5/1986 | Tanaami et al. | .............. | 323/229 |
| 4,754,233 A * | 6/1988 | Pickett | ........................ | 330/311 |
| 4,945,880 A * | 8/1990 | Gonze et al. | ................. | 123/674 |
| 5,416,441 A * | 5/1995 | Nagano | ........................ | 330/129 |
| 5,528,633 A * | 6/1996 | Halik et al. | .................... | 375/326 |
| 5,706,060 A * | 1/1998 | Ruitenburg | ................... | 348/725 |
| 6,037,999 A * | 3/2000 | Kunishima | ................... | 348/731 |
| 6,339,356 B1 * | 1/2002 | Daughtry et al. | ............. | 327/308 |
| 6,977,555 B2 * | 12/2005 | Kotera et al. | ................. | 330/305 |
| 7,142,060 B1 * | 11/2006 | Maeda | .......................... | 330/295 |
| 2002/0021903 A1 * | 2/2002 | Ito et al. | ........................ | 396/429 |
| 2004/0157575 A1 * | 8/2004 | Kim | ............................ | 455/249.1 |
| 2005/0138659 A1 * | 6/2005 | Boccon-Gibod et al. | ....... | 725/58 |
| 2005/0259186 A1 * | 11/2005 | Mehr et al. | .................... | 348/731 |

FOREIGN PATENT DOCUMENTS

EP    0509733  A2    10/1992
WO   2004055980 A2    7/2004

* cited by examiner

*Primary Examiner* — Duc Nguyen
*Assistant Examiner* — Charles Chow

(57) ABSTRACT

A receiver has an input stage (LNA) that comprises, in a signal direction from an input (SI) to an output (SO), an input transistor (Q1) and an attenuator (D1, D2, R7-R12, C2-C5). The attenuator provides an attenuation that depends on a control signal (VDC). The input stage comprises a transistor-biasing circuit (R2) that biases the input transistor in dependence on the control signal.

14 Claims, 2 Drawing Sheets

RECEIVER HAVING A GAIN-CONTROLLABLE INPUT STAGE

FIELD OF THE INVENTION

An aspect of the invention relates to a receiver that has a gain-controllable input stage. The receiver may be, for example, a digital-video recorder that can be coupled to a cable network via which a plurality of channels is transmitted to user homes. In such a digital-video recorder, the gain-controllable input stage typically transfers the plurality of channels to a tuner, which allows selection of a particular channel. Another aspect of the invention relates to a method of operating a receiver.

BACKGROUND OF THE INVENTION

U.S. Pat. No. 5,706,060 describes a video recorder with an RF receiving section that receives an antenna signal. The RF receiving section includes wideband amplifiers, which are connected to inductances. One wideband amplifier constitutes an input amplifier for the RF receiver section. Another wideband amplifier constitutes a signal path that loops through the antenna signal to a television receiver.

SUMMARY OF THE INVENTION

According to an aspect of the invention, a receiver has an input stage that comprises, in a signal direction from an input to an output, an input transistor and an attenuator. The attenuator provides an attenuation that depends on a control signal. The input stage comprises a transistor-biasing circuit that biases the input transistor in dependence on the control signal.

The invention takes the following aspects into consideration. An input stage of a receiver, which is coupled to the cable network, will typically receive relatively strong signals. An input transistor, which forms part of the input stage, will amplify these signals. There is a risk that subsequent stages receive signals that are so strong that these subsequent stages introduce distortion and, as a result, degrade reception quality. The subsequent stages become overloaded, as it were. An attenuator, which forms part of the input stage, can provide some attenuation in order to prevent such overload. In addition, the input transistor of the input stage is biased so that distortion, which the input stage may introduce, is at an acceptable level. Noise is of lesser importance. Since reception signals are typically relatively strong, there will be an acceptable signal-to-noise ratio even when there is relatively much noise.

It may happen that reception signals are relatively weak. In order to achieve an acceptable signal-to-noise ratio, the attenuation within the input stage can be reduced. There is less attenuation under weak-signal conditions than under typical, strong-signal conditions. The attenuation can be reduced to a point where the input stage provides some signal gain. This signal gain reduces the extent to which the subsequent stages contribute to overall receiver noise. The subsequent stages will play a relatively modest role in terms of noise. The input stage will play a relatively important role in terms of noise. That is, the input stage will substantially determine overall receiver noise when there is little attenuation within the input stage or even no attenuation at all.

The input transistor substantially determines noise properties of the input stage. In particular, the noise properties depend on a biasing of the input transistor. In general, there is a particular biasing range within which the input transistor has relatively low noise. This low-noise biasing range need not correspond with a preferred biasing for typical, strong-signal conditions as described hereinbefore. Consequently, an input stage, which has been designed to provide satisfactory performance under these typical conditions, may produce relatively much noise.

In accordance with the aforementioned aspect of the invention, the input stage comprises a transistor-biasing circuit that biases the input transistor in dependence on the control signal, which is used to control the attenuation.

Accordingly, the input transistor can have a low-noise biasing when there is relatively little attenuation, which will be the case under weak-signal conditions. This does not prevent the input transistor from having a strong-signal biasing when there is relatively much attenuation, which will be the case under strong-signal conditions. For those reasons, the invention allows an improved low-noise operation, which contributes to relatively good receiver sensitivity.

These and other aspects of the invention will be described in greater detail hereinafter with reference to drawings.

DETAILED DESCRIPTION

Figure 1:
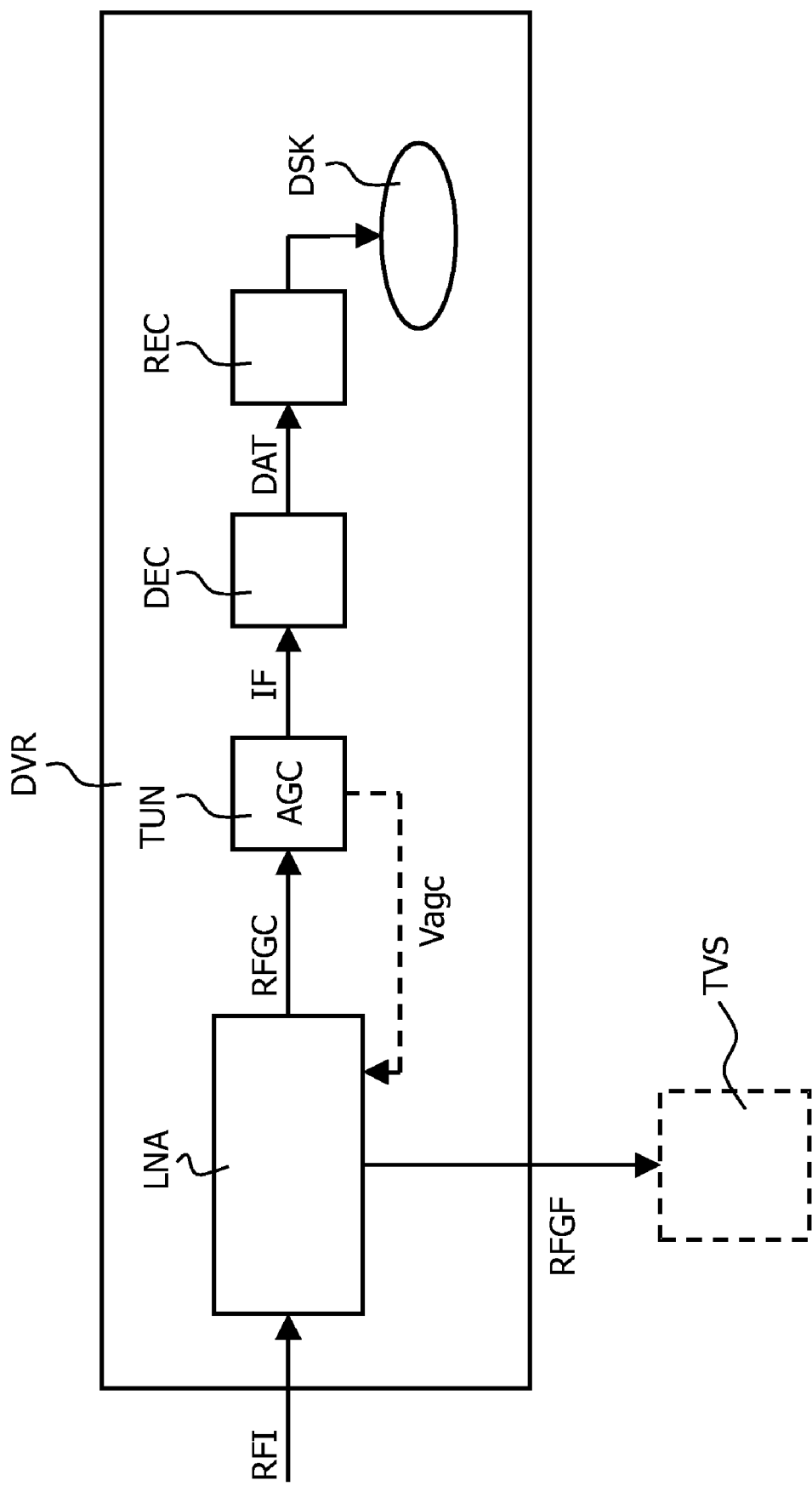
FIG. 1 is a block diagram that illustrates a digital-video recorder.

FIG. 1 illustrates a digital-video recorder DVR, such as, for example, a digital versatile disk (DVD) recorder or a hard disk drive (HDD) recorder, or a combination of both. The digital-video recorder DVR may be comprised in, for example, a so-called set-top box for a cable network. The digital-video recorder DVR will typically have a mains supply.

The digital-video recorder DVR selects a desired signal present within a radiofrequency spectrum RFI received an input. The desired signal conveys data. The digital-video recorder DVR records this data on a disk. The digital-video recorder DVR may be coupled to a television set TVS, which is illustrated by means of broken lines, or any other type of receiver.

The digital-video recorder DVR comprises a gain-controllable input stage LNA, a tuner TUN, a decoder DEC, and a recorder REC. The gain-controllable input stage LNA amplifies the radiofrequency spectrum RF. The gain-controllable input stage LNA provides two output signals: a controllable-gain amplified radiofrequency spectrum RFGC and a fixed-gain amplified radiofrequency spectrum RFGF. The tuner TUN of the digital-video recorder DVR receives the controllable-gain amplified radiofrequency spectrum RFGC. The television set TVS receives the fixed-gain amplified radiofrequency spectrum RFGF. The fixed-gain amplified radiofrequency spectrum RFGF thus constitutes a so-called loop-through signal that may be applied one or more other apparatuses, such as the television set TVS illustrated in FIG. 1.

The tuner TUN provides an intermediate frequency signal IF in response to the controllable-gain amplified radiofrequency spectrum RFGC. The intermediate frequency signal IF is a frequency-shifted version of the desired signal in the radiofrequency spectrum RFI. Other signals in the radiofrequency spectrum RFI are attenuated to a relatively great extent. The decoder DEC retrieves recordable data DAT from the intermediate frequency signal IF. The recordable data DAT may represent, for example, a movie. The recorder REC records the recordable data DAT on the disk that is present within the digital-video recorder DVR.

The tuner TUN may comprise an automatic-gain-control circuit AGC, which prevents that relatively strong signals degrade reception quality. To that end, the automatic-gain-control circuit AGC adjusts a signal gain that the tuner provides. The signal gain is relatively high under weak-signal reception conditions. Conversely, the signal gain is relatively low under strong-signal reception conditions. An automatic-gain-control voltage Vagc, which determines the signal gain, indicates whether relatively strong signals or relatively weak signals are present in the radiofrequency spectrum RFI.

Figure 2:
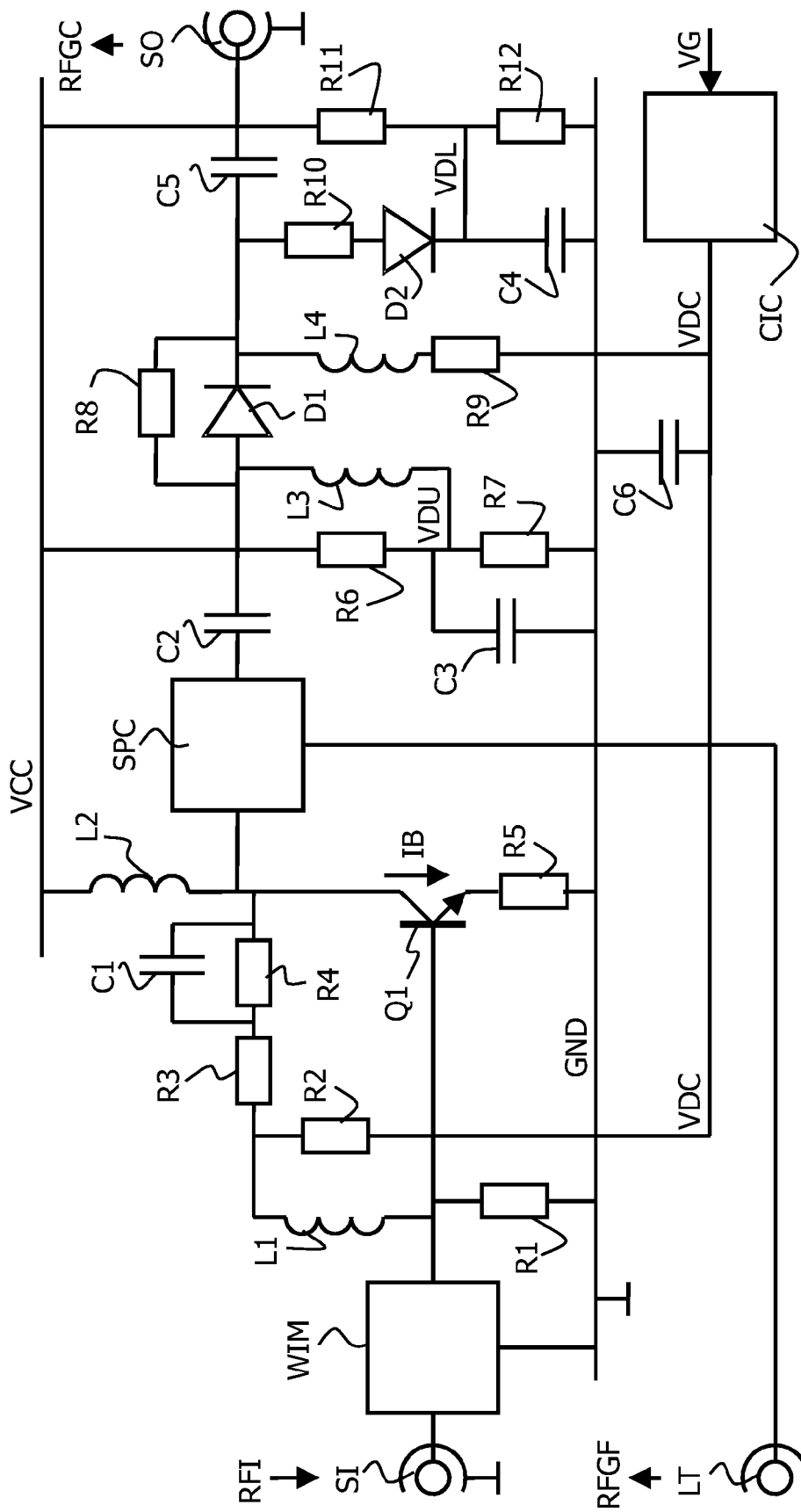
FIG. 2 is a circuit diagram that illustrates a gain-controllable input stage of the digital-video recorder.

FIG. 2 illustrates the gain-controllable input stage LNA. The gain-controllable input stage LNA comprises an input SI, which receives the radiofrequency spectrum RFI, and an output SO, which provides the controllable-gain amplified radiofrequency spectrum RFGC. The gain-controllable input stage LNA further comprises a loop-through output LT, which provides the fixed-gain amplified radiofrequency spectrum RFGF. The gain-controllable input stage LNA has a gain control input, which receives a gain-control value VG. The gain-control value VG may be, for example, the automatic-gain-control voltage Vagc of the tuner, which FIG. 1 illustrates by means of broken lines.

The gain-controllable input stage LNA comprises an input transistor Q1, two diodes D1 and D2, various resistances R1, R2, . . . , R12, various capacitances C1, C2, . . . , C6, and various inductances L1, L2, L3, L4. The gain-controllable input stage LNA has a power-supply path VCC and a signal-ground path GND between which a power supply voltage is applied. The gain-controllable input stage LNA further comprises a wideband impedance-matching circuit WIM, a signal-splitting circuit SPC, and a control-interface circuit CIC. The control-interface circuit CIC provides a controllable diode-biasing voltage VDC, which depends on the gain-control value VG that the gain-controllable input stage LNA receives.

The respective roles of the aforementioned elements will now be briefly described, in a signal direction from the input SI to the output SO.

The wideband impedance-matching circuit WIM allows the gain-controllable input stage LNA to have an input impedance that is within a desired impedance range throughout a relatively wide range of frequencies. The desired impedance range typically has a center value of 50 Ohm or 75 Ohm. Consequently, the gain-controllable input stage LNA will reflect signals to a relatively small extent only, when the input is coupled to a cable network. Stated otherwise, the gain-controllable input stage LNA has relatively small return loss throughout a relatively wide range of frequencies. The wideband impedance-matching circuit WIM may include, for example, various inductances and capacitances, which are coupled in a so-called L, T, or π configuration, or any combination of those.

Resistances R1, R2, R3, R4, and R5 and inductances L1 and L2 allow a bias current IB to flow through the input transistor Q1. The bias current IB depends on the respective values of resistances R1, R2, R3, R4, and R5 and the controllable diode-biasing voltage VDC that the control-interface circuit CIC provides. Resistances R3 and R4, capacitance C1, and inductance L1 constitute a feedback circuit between a collector and a base of the input transistor Q1. Resistance R5, which is coupled between an emitter of the input transistor Q1 and signal ground, also provides a certain signal feedback. The input transistor Q1 provides a signal gain, which these feedback elements substantially determine. Inductance L2 constitutes a collector-load impedance for the input transistor Q1.

An amplified input signal is present at the collector of the input transistor Q1. The signal-splitting circuit SPC splits the amplified signal into two portions. One portion flows to the loop-through output LT. The other portion flows to the output SO via an attenuator. The output SO thus receives an attenuated version of the amplified signal, which the input transistor Q1 provides.

The two diodes D1 and D2 form the heart of the attenuator, which is present between the input transistor Q1 and the output SO. The attenuator further comprises inductances L3 and L4, capacitances C2, C3, C4, and C5 and resistances R6, R7, R8, R9, R10, R11 and R12.

Resistances R6 and R7 form a voltage divider, which is coupled between the power-supply path VCC and the signal-ground path GND. This voltage divider provides an upper diode-biasing voltage VDU. Likewise, resistances R11 and R12 form another voltage divider, which provides a lower diode-biasing voltage VDL. The upper diode-biasing voltage VDU is preferably two diode-junction voltages higher than the lower diode-biasing voltage VDL.

Diode D1 has an anode, which receives the upper diode-biasing voltage VDU via inductance L3, and a cathode, which receives the controllable diode-biasing voltage VDC via resistance R9 and inductance L4. Diode D2 has an anode, which receives the controllable diode-biasing voltage VDC via resistance R9, inductance L4, and resistance R10, and a cathode, which receives the lower diode-biasing voltage VDL.

Inductances L3 and L4 provide a signal decoupling in the sense of preventing a signal transfer. Capacitances C2 and C5 provide a direct-current decoupling in the sense of preventing a direct-current transfer. Capacitances C3, C4, and C6 provide a signal-ground coupling in the sense of short-circuiting to signal ground.

The gain-controllable input stage LNA operates in a low-gain mode when the controllable diode-biasing voltage VDC has a relatively high value. For example, the low-gain mode applies when the controllable diode-biasing voltage VDC is higher than the upper diode-biasing voltage VDU. It is recalled that the anode of diode D1 receives the upper diode-biasing voltage VDU and that the cathode receives the controllable diode-biasing voltage VDC. Consequently, in the low-gain mode, the anode of diode D1 receives a voltage that is lower than the voltage which the cathode receives. As a result, diode D1 will be substantially non-conducting and, therefore, will constitute a relatively high impedance. Conversely, diode D2 will be substantially conducting and, therefore, will constitute a relatively low impedance. This is because the controllable diode-biasing voltage VDC, which the anode of diode D2 receives, is at least one diode-junction voltage higher than the lower diode-biasing voltage VDL, which the cathode receives.

There will be relatively much attenuation from the input transistor Q1 to the output SO in the low-gain mode. Resistances R8 and R10 substantially determine that attenuation. Diode D1 can be seen as an open circuit and diode D2 can be seen as a short circuit in the low-gain mode.

The gain-controllable input stage LNA operates in a high-gain mode when the controllable diode-biasing voltage VDC has relatively low value. For example, the high-gain mode applies when the controllable diode-biasing voltage VDC is lower than the lower diode-biasing voltage VDL. Diode D1 will be substantially conducting and, therefore constitute a relatively low impedance. This is because the upper diode-biasing voltage VDU, which the anode of diode D1 receives, is at least one diode-junction voltage higher than the controllable diode-biasing voltage VDC, which the cathode receives. Conversely, diode D2 will be substantially non-conducting and, therefore constitute a relatively high impedance. This is because the lower diode-biasing voltage VDL, which the cathode of diode D2 receives, is higher than the controllable diode-biasing voltage VDC, which the anode receives.

There will be relatively little attenuation from the input transistor Q1 to the output SO in the high-gain mode. Diode D1 can be seen as a short circuit and diode D2 can be seen as an open circuit in the high-gain mode. Resistances R8 and R10 have little influence and do not introduce any significant signal loss.

In the high-gain mode, the gain-controllable input stage LNA provides a signal gain from the input SI to the output SO. This signal gain substantially corresponds with the signal gain that the input transistor Q1 provides. The signal gain reduces the extent to which the tuner TUN affects reception sensitivity of the digital-video recorder DVR. Any tuner noise will play a relatively modest role. Conversely, any noise that the gain-controllable input stage LNA produces plays a relatively important role. That is, the gain-controllable input stage LNA will substantially determine reception sensitivity in the high-gain mode.

The bias current IB that flows through the input transistor Q1 substantially determines the noise that the gain-controllable input stage LNA produces. The noise is relatively modest in a particular bias-current range. This low-noise bias-current range need not necessarily coincide with another bias-current range, in which the input transistor Q1 preferably operates in the low-gain mode.

In the gain-controllable input stage LNA, which is illustrated in FIG. 2, the bias current IB of the input transistor Q1 depends on the controllable diode-biasing voltage VDC, which is applied to the two diodes D1 and D2 that provide controllable attenuation. The controllable diode-biasing voltage VDC affects the bias current IB through resistance R2. Resistance R2 causes the bias current IB to decrease when the controllable diode-biasing voltage VDC decreases. Consequently, the bias current IB is lower in the high-gain mode than in the low-gain mode. This lowering of the bias current IB reduces the noise that the input transistor Q1 produces. As a result, the gain-controllable input stage LNA will have relatively good noise properties in the high-gain mode. What is more, the digital video recorder will have a relatively good reception sensitivity, as explained hereinbefore.

The low-gain mode and the high-gain mode described hereinbefore are examples of two extremes. The gain-controllable input stage may operate in numerous different modes, which are in between these two extremes. In that respect, it should be noted that the control-interface circuit CIC may adjust the controllable diode-biasing voltage VDC in a continuous fashion in dependence on the gain-control value VG. The control-interface circuit CIC may also adjust the controllable diode-biasing voltage VDC in discrete steps. It has been mentioned hereinbefore that the automatic-gain-control voltage Vagc of the tuner TUN, which FIG. 1 illustrates, may constitute gain-control value VG. In that case, the control-interface circuit CIC may comprise direct-current-shifting circuits and, if needed, an inverter.

The table below illustrates an example of a relationship between the signal gain of the gain-controllable input stage LNA and the bias current IB of the input transistor Q1 comprised therein.

| SIGNAL GAIN: | BIAS CURRENT (IB): |
|---|---|
| −15.0 dB | 70 mA |
| −10.0 dB | 62 mA |
| −5.0 dB | 58 mA |
| 0.0 dB | 45 mA |
| +5.0 dB | 25 mA |

CONCLUDING REMARKS

The detailed description hereinbefore with reference to the drawings illustrates the following characteristics, which are cited in claim 1. A receiver (DVR) has an input stage (LNA) that comprises, in a signal direction from an input (SI) to an output (SO), an input transistor (Q1) and an attenuator (D1, D2, R7-R12, C2-C5). The attenuator provides an attenuation that depends on a control signal (VDC). A transistor-biasing circuit (R2) biases the input transistor in dependence on the control signal.

The detailed description hereinbefore further illustrates the following optional characteristics, which are cited in claim 2. The transistor-biasing circuit (R2) decreases a bias current (IB) that flows through the input transistor (Q1), in response to a change in the control signal (VDC) that causes the attenuation to decrease. In many implementations, such an attenuation-dependent biasing reduces input-transistor noise under weak-signal conditions.

The detailed description hereinbefore further illustrates the following optional characteristics, which are cited in claim 3. The attenuator (D1, D2, R7-R12, C2-C5) comprises a series-coupled diode (D1), which is coupled between the input transistor (Q1) and the output (SO), and a shunt-coupled diode (D2), which is coupled between the output (SO) and signal ground (GND). A diode-biasing circuit (R9, L4) biases the series-coupled diode and the shunt-coupled diode in dependence on the control signal (VDC). These characteristics allow low-distortion signal attenuation.

The detailed description hereinbefore further illustrates the following optional characteristics, which are cited in claim 4. The attenuator (D1, D2, R7-R12, C2-C5) comprises a shunt-coupled resistance (R8), which is coupled in parallel with the series-coupled diode (D1); and a series-coupled resistance (R10), which is coupled in series with the shunt-coupled diode (D2). These characteristics allow further contribute to low-distortion signal attenuation.

The detailed description hereinbefore further illustrates the following optional characteristics, which are cited in claim 6. The receiver comprises a tuner (TUN), which receives an input signal (RFGC) from the output (SO) of the input stage (LNA). The tuner (TUN) comprises an automatic-gain-control circuit (AGC) that provides an automatic gain control signal (Vagc). The receiver comprises a coupling circuit (CIC) that derives the control signal (VDC) for the input stage (LNA) from the automatic gain control signal of the tuner. These characteristics allow cost-efficient implementations.

The aforementioned characteristics can be implemented in numerous different manners. In order to illustrate this, some alternatives are briefly indicated.

The input transistor may be a field-effect transistor or any other type of transistor. The biasing circuit may comprise active components. For example, let it be assumed that the gain-controllable amplifier LNA, which FIG. 1 illustrates, is modified so that the input transistor Q1 is a PNP transistor rather than an NPN. In that case, the biasing circuit may comprise an inverting transistor so as to achieve that the bias current of the PNP transistor decreases when the attenuation decreases.

The attenuator may be a transistor-based attenuator or any other type of attenuator. The control signal, on which the attenuation depends, may be a current rather than a voltage. In that respect, it should be noted that the gain-control value VG, which the gain-controllable amplifier LNA illustrated in FIG. 2 receives, may be a digital value. Such a digital value may originate from a controller comprised in the digital-video recorder DVR. Alternatively, the gain-control controllable amplifier LNA may comprise a signal-level detector that provides the gain-control value VG. In such an implementation, the gain-control value VG need not come from another functional entity.

Although the signal-splitting circuit SPC in the gain-controllable input stage LNA, which FIG. 2 illustrates, allows a signal loop-through, such a signal-splitting circuit can be omitted in implementations that do not require a signal loop-through. Although the gain-controllable input stage LNA is particularly advantageous in a cable-network connectable receiver, such as the digital-video recorder DVR that FIG. 1 illustrates, the gain-controllable input stage LNA may be used to advantage in other types of receivers.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software carries out several functions. Nor does it exclude that an assembly of items of hardware or software or both carry out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps.

The invention claimed is:

1. A receiver having an input stage comprising in a signal direction from an input to an output: an input transistor; and an attenuator, which provides an attenuation that depends on a control signal, the input stage comprising a transistor-biasing circuit arranged to bias the input transistor in dependence on the control signal, the attenuator comprising: a series-coupled diode, which is coupled between the input transistor and the output; and a shunt-coupled diode, which is coupled between the output and signal ground, wherein a cathode of the series-coupled diode is connected to an anode of the shunt-coupled diode and the output, wherein an anode of the series-coupled diode is connected to a first voltage divider, wherein a cathode of the shunt-coupled diode is connected to a second voltage divider, and wherein the second voltage divider provides a lower diode-biasing voltage than the first voltage divider, wherein the input stage further comprises a signal-splitting circuit configured to split a signal at the collector of the input transistor into a first portion and a second portion, wherein the first portion flows to a loop-through output, and wherein the second portion flows to the output of the receiver via the attenuator.

2. A receiver as claimed in claim 1, the transistor-biasing circuit being arranged to decrease a bias current that flows through the input transistor, in response to a change in the control signal that causes the attenuation to decrease.

3. A receiver as claimed in claim 1, the attenuator further comprising: a diode-biasing circuit arranged to bias the series-coupled diode and the shunt-coupled diode in dependence on the control signal.

4. A receiver as claimed in claim 3, the attenuator comprising: a shunt-coupled resistance, which is coupled in parallel with the series-coupled diode; and a series-coupled resistance, which is coupled in series with the shunt-coupled diode.

5. A receiver as claimed in claim 1, the receiver comprising a tuner coupled to receive an input signal from the output of the input stage.

6. A receiver as claimed in claim 5, the tuner comprising an automatic-gain-control circuit that provides an automatic-gain-control signal, the receiver comprising a coupling circuit arranged to derive the control signal for the input stage from the automatic-gain-control signal of the tuner.

7. A receiver as claimed in claim 1, the input stage comprising a wideband impedance-matching circuit coupled between the input and the input transistor.

8. The receiver of claim 1, wherein the first voltage divider and the second voltage divider are coupled to a power supply and the signal ground.

9. The receiver of claim 1, wherein the input is configured to receive a radiofrequency signal, wherein the output of the receiver is configured to output a controllable-gain amplified radiofrequency signal, and wherein the loop-through output is configured to output a fixed-gain amplified radiofrequency signal.

10. The receiver of claim 1, wherein the input transistor is a PNP transistor, and wherein the transistor-biasing circuit comprises an inverting transistor.

11. The receiver of claim 1, wherein the control signal is a current.

12. The receiver of claim 1, wherein the receiver further comprises a coupling circuit configured to derive the control signal for the input stage from a digital value.

13. A method of operating a receiver that has an input stage, which comprises in a signal direction from an input to an output: an input transistor; and an attenuator, which provides an attenuation that depends on a control signal, the attenuator comprising: a series-coupled diode, which is coupled between the input transistor and the output; and a shunt-coupled diode, which is coupled between the output and signal ground, wherein a cathode of the series-coupled diode is connected to an anode of the shunt-coupled diode and the output, wherein an anode of the series-coupled diode is connected to a first voltage divider, wherein a cathode of the shunt-coupled diode is connected to a second voltage divider, wherein the second voltage divider provides a lower diode-biasing voltage than the first voltage divider, wherein the input stage further comprises a signal-splitting circuit configured to split a signal at the collector of the input transistor into a first portion and a second portion, wherein the first portion flows to a loop-through output, and wherein the second portion flows to the output of the receiver via the attenuator, the method comprising: a transistor-biasing step in which the input transistor is biased in dependence on the control signal.

14. A digital-video recorder comprising:
an input stage configured to generate a controllable-gain amplified radiofrequency spectrum signal in response to a radiofrequency spectrum signal, the input stage comprising in a signal direction from an input to an output: an input transistor; and an attenuator, which provides an attenuation that depends on a control signal, the input stage comprising a transistor-biasing circuit arranged to bias the input transistor in dependence on the control signal, the attenuator comprising: a series-coupled diode, which is coupled between the input transistor and the output; and a shunt-coupled diode, which is coupled between the output and signal ground, wherein a cathode of the series-coupled diode is connected to an anode of the shunt-coupled diode and the output, wherein an anode of the series-coupled diode is connected to a first voltage divider, wherein a cathode of the shunt-coupled diode is connected to a second voltage divider, wherein the second voltage divider provides a lower diode-biasing voltage than the first voltage divider, wherein the input stage further comprises a signal-splitting circuit configured to split a signal at the collector of the input transistor into a first portion and a second portion, wherein the first portion flows to a loop-through output, and wherein the second portion flows to the output of the receiver via the attenuator;

a tuner configured to provide an intermediate frequency signal in response to the controllable-gain amplified radiofrequency spectrum signal;

a decoder configured to retrieve recordable data from the intermediate frequency signal; and a recorder configured to record the recordable data.

\* \* \* \* \*